United States Patent
Palladino

(10) Patent No.: US 7,498,772 B2
(45) Date of Patent: Mar. 3, 2009

(54) METHOD AND SYSTEM OF MODELING ENERGY FLOW FOR VEHICLE BATTERY DIAGNOSTIC MONITORING

(75) Inventor: James Palladino, Winona Lake, IN (US)

(73) Assignee: International Truck Intellectual Property Company, LLC, Warrenville, IL (US)

( * ) Notice: Subject to any disclaimer, the term of this patent is extended or adjusted under 35 U.S.C. 154(b) by 362 days.

(21) Appl. No.: 11/399,213

(22) Filed: Apr. 6, 2006

(65) Prior Publication Data

US 2007/0236181 A1 Oct. 11, 2007

(51) Int. Cl.
*H02J 7/00* (2006.01)

(52) U.S. Cl. .................. 320/132; 324/431; 324/434; 324/427

(58) Field of Classification Search .............. 320/132; 324/426–436
See application file for complete search history.

(56) References Cited

U.S. PATENT DOCUMENTS

| | | | |
|---|---|---|---|
| 4,968,942 A | 11/1990 | Palanisamy | |
| 5,281,919 A | 1/1994 | Palanisamy | |
| 6,392,415 B2 | 5/2002 | Laig-Hörstebrock et al. | |
| 6,417,668 B1 | 7/2002 | Howard et al. | |
| 6,646,419 B1 | 11/2003 | Ying | |
| 6,690,140 B2 | 2/2004 | Larson | |
| 2004/0155661 A1* | 8/2004 | Field et al. | 324/426 |
| 2004/0212367 A1 | 10/2004 | Dougherty | |
| 2005/0017685 A1 | 1/2005 | Rees et al. | |
| 2006/0284617 A1* | 12/2006 | Kozlowski et al. | 324/426 |

OTHER PUBLICATIONS

Johnson, Valerie H., Ahmad A. Pesaran, and Thomas Sack, "Temperature-Dependent Battery Models For High-Power Lithium-Ion Batteries," 17th Electric Vehicle Symposium, Montreal, Canada, Oct. 16-18, 2000.

C. Leontopoulos, M. R. Etemad, K. R. Pullen, and M. U. Lamperth, "Hybrid Vehicle Simulation For A Turbogenerator-Based Power-Train," IMechE 1998, Proc Instn Mech Engrs, vol. 212. Part D.

"Lead Acid Battery Model," Saber Electronic Simulator, Generic Template Library, Oct. 1999, Synopsis, Inc., 700 East Middlefield Rd., Mountain View, CA.

* cited by examiner

*Primary Examiner*—Adolf Berhane
*Assistant Examiner*—Samuel Berhanu
(74) *Attorney, Agent, or Firm*—Mark C. Bach; Jeffrey P. Calfa

(57) ABSTRACT

A lead acid battery model suitable for programming on a motor vehicle body computer uses environmental and target battery operating variables for maintaining synchronization of the model with the target battery under actual operating conditions. The model includes a energy flow section with at least two integrators for simulating primary and recovery reservoirs of charge in the battery. An output voltage estimation signal provides a signal for comparison with measured battery voltage for synchronization. Capacity of the reservoirs is generated from manufacturer specifications measured against battery performance.

16 Claims, 16 Drawing Sheets

METHOD AND SYSTEM OF MODELING ENERGY FLOW FOR VEHICLE BATTERY DIAGNOSTIC MONITORING

BACKGROUND OF THE INVENTION

1. Technical Field

The invention relates to in situ monitoring of the state of charge of a motor vehicle battery, particularly a lead acid battery.

2. Description of the Problem

Lead acid batteries are the conventional source for power used by automatic starters to crank start internal combustion engines installed on motor vehicles. Lead acid batteries also provide auxiliary power for other electrical components installed on such vehicles. Failure of a battery to supply power for starting can necessitate jump starting the engine or an expensive and time consuming call to service for assistance. It would be an advantage to operators to receive warning of impending battery failure in time to take corrective action before failure of a battery in the field.

The lead-acid batteries typically used in vehicles are rated according to the Society of Automotive Engineers SAE J537 specification. The J537 specification defines two different ways in which capacity is measured, Cold Cranking Amps (CCA), and Reserve Capacity (RC). CCA is an indication of a battery's ability to deliver high power for a short duration (the amperage that a fully charged battery it expected to deliver for 30 sec.). RC is an indication of total energy capacity (the number of minutes that a battery can deliver 25 amps). For example, a battery rated at 650 CCA is expected to delivered 650 amps for 30 sec. (under the controlled conditions set forth in the specification). Likewise, a battery rated at 180 RC is expected to deliver 25 amps of current for 180 minutes.

Lead acid batteries are constructed from closely spaced, alternating plates of sponge lead (Pb), which serve as the negative plates, and lead dioxide ($PbO_2$), which serve as the positive plates. The plates are preferably substantially immersed in a sulfuric acid ($H_2SO_4$) water solution, which serves as an electrolyte. During discharge of the battery both plates react with the electrolyte and lead sulfate ($PbSO_4$) forms on both the negative and positive plates. The concentration of acid in the electrolyte decreases. As the plates become more chemically similar and the acid strength of the electrolyte falls, a battery's voltage will begin to fall. From fully charged to fully discharged each cell loses about 0.2 volts in potential (from about 2.1 volts to 1.9 volts). The rate at which the reaction occurs governs energy flow and battery power characteristics. Many factors control the reaction rate, such as the amount of active material in the plates and the availability of the acid. When a battery discharges, the acid in the pores of the lead plates react first. The depleted electrolyte at the plates is replenished by the electrolyte in the rest of the battery. A lead acid battery thus can be viewed as having multiple reservoirs of available energy. One that is available for immediate use, the primary reservoir, and secondary reservoirs that replenish the primary. The physical integrity of the plates and the purity and concentration of the electrolyte determine the battery's total potential.

Optimally, recharging a battery would reverse the process of discharge, strengthening the acid in the electrolyte and restoring the original chemical makeup and physical structure of the plates. In practice however, the chemical reactions and resulting physical changes that produce current during discharge are not perfectly reversible. The reasons for this are several. For example, input and output currents are not symmetric. A motor vehicle battery can discharge several hundred ampere-seconds during the relatively brief period of cranking of an engine. Recharging then occurs during the first few minutes after the engine begins running at far lower rates of current flow. The cycle of repeated discharge and subsequent recharge of lead acid batteries results in chemical imbalances in and loss of the electrolyte solution, the formation of undesirable compounds on battery plates and physical deterioration of the plates.

Recharging a battery has various secondary effects, including polarization of the battery, overheating and the electrolytic decomposition of the water into molecular hydrogen and oxygen. These factors contribute to the battery not returning to its original state. Electrolysis of the water in the electrolyte reduces the physical volume, and quantity, of the electrolyte. Electrolytic breakdown of the water leaves the electrolyte excessively acidic, with consequential degradation of the battery plates. High temperatures developed during recharging can promote sulfation of the battery plates (i.e. the formation of hardened, relatively insoluble crystalline lead sulfate on the surface of the plates), which in turn increases a battery's internal resistance. To some extent sulfation and other factors resulting in the slow reduction of a lead acid battery's charge capacity can be controlled by avoiding overcharging, or by avoiding overheating of the battery stemming from excessively fast recharging, but in practice the slow deterioration of a battery is unavoidable.

Polarization results in a poorly mixed electrolyte and a condition where battery voltage reflects a full 2.1 volts per cell, but only because local areas of the electrolyte contain overconcentrations of acid, which in turn can damage the plates.

As the physical condition of a battery deteriorates, its capacity to hold a charge, in terms of ampere-hours declines. This is the case even though the battery continues to exhibit a 2.1 volt potential per cell when charged to maximum. Accordingly, battery state of charge and available battery cranking power are not, over the long term, accurately reflected by open circuit voltage.

Battery condition is best indicated by the specific gravity of the battery's electrolytic solution. Conventionally, the best way to gauge the state of charge of a lead acid battery has been to measure the specific gravity of the electrolyte of a properly filled (and exercised) battery using a temperature compensated hydrometer. A load test of the battery under controlled conditions may be used, either in conjunction with a check of specific gravity or independently. A load test subjects a fully charged battery to an ampere load equal to ½ the rated cold cranking capacity of the battery (at −18 degrees Celsius) for 15 seconds, then measures the voltage and the current under load and requires referral to a voltage chart to assess battery condition. See page 48, Storage Battery Technical Service Manual, Tenth Edition, published by the Battery Council International, Chicago, Ill. (1987). Such procedures are obviously not easily practiced in the field, where driver/operators of vehicles could make use of a quick indication if a battery has sufficient cranking power to start an engine.

To meet the need for battery condition evaluation in the field and to provide an accurate estimation of a battery's state of charge (SOC), the prior art has proposed numerous battery condition monitoring systems which rely on indirect indications of battery condition. In broad overview, a lead-acid battery will exhibit different operating characteristics when new as opposed to when used. As the battery deteriorates it will exhibit a higher internal resistance, and will not accept as great an input current. Voltage under load will fall off more rapidly. Indicators related to these factors may be monitored to give an indication of battery condition. However, difficulties arise from the inability to control the conditions of the evaluation.

One such system directed to determining battery condition is U.S. Pat. No. 5,744,963 to Arai et al. Arai teaches a battery residual capacity estimation system. Residual capacity is estimated from a current integration method which utilizes a voltage-current trend calculating section, sensors for obtaining battery current and terminal voltage, a voltage-current straight line calculating section, and a comparator operation for detecting when residual capacity has declined compared to a prior period residual capacity.

Palanisamy, U.S. Pat. No. 5,281,919, describes another method of monitoring a vehicle battery used with a gasoline engine. Five variables are monitored including ambient temperature (T), battery voltage (V), power source (typically an alternator/voltage regulator) voltage ($V_s$), battery current (I) and time (t). From these variables, the patent provides algorithms for determining the battery's State of Charge (SOC), internal resistance (IR), polarization, and performs various diagnostics.

Palanisamy determines the battery's SOC using a combination of charge integration and open circuit voltage measurements. The open circuit portion of the test relies on a 0.2 voltage drop per cell from a fully charged lead acid cell to a discharged lead acid cell. Open circuit battery voltage (OCV or VOCV) may be taken with the engine on, but is measured at a point in time which avoids effects of polarization of the battery. Open circuit voltage is deemed to coincide with the absence of current flows into or out of the battery for a minimum period. Current integration counts current flow (I) into and out of the battery. Monitoring starts from a point of predetermined charge of the battery, preferably a full charge as determined by the open circuit voltage test. As Palanisamy observes, current integration is subject to error from battery out gassing and deterioration of the physical condition of the battery. The combination of the results is offered as an improvement in measurement of a battery's state of charge, but, due to the systematic errors identified in the patent, is not an necessarily an accurate measurement of the battery's condition.

Internal resistance (IR) is estimated from the open circuit voltage and current flow from the battery following imposition of the starting load. Power output capacity is estimated from IR. Battery polarization arises from non-uniformity of electrolyte density between battery plates and is estimated using $V_s$, I and the last battery voltage reading during starting. IR can be used to get battery output capacity for a variety at various temperatures, and then used for a comparison to a table of engine start power requirements supplied by the engine manufacturer.

Palanisamy is limited due to the fact that, under common operating conditions, the current required to crank a gasoline engine is substantially less than the load requirements of a standard load test. Cranking of a gasoline engine usually does not generate data of anywhere near the quality of data produced by controlled condition load test making reference to published voltage charts useless as a mechanism for determining battery conditional.

U.S. Pat. No. 6,417,668 to Howard, et al., which is assigned to the assignee of the current application, described an in situ battery monitoring system. Howard provides that upon movement of a vehicle ignition switch from off to on, a process of evaluating the vehicle battery starts. Open circuit voltage and ambient temperature are measured. The open circuit voltage is compared to a table of allowable open circuit voltage ranges as a function of ambient temperature to determine, as an initial matter, if the open circuit voltage is within acceptable ranges for the battery as indicated by manufacturer's specifications. If the open circuit voltage falls within the acceptable range, it is determined if sufficient time has passed since the most recent execution of the routine to avoid polarization effects on the measured open circuit voltage.

If the possibility of polarization effects on the measured open circuit voltage is indicated by a brief lapse since the vehicle battery was last exercised, a load test is imposed on the vehicle battery by engaging an engine starter system to crank the vehicle engine. If the test is automated a safety interlock may be provided based, for example, on whether the hood is open or closed. After a period T, which is preferably fixed in advance, of cranking the engine, voltage across the terminals of the vehicle battery and current from the vehicle battery are measured. Both measurements occur while the battery remains under the load imposed by cranking. A empirically developed specification table indicates battery capacity as a function of the results of the load test. The table may be updated by battery history. An engine required cranking power specification using engine sensor measurements as inputs provides a value for comparison to the capacity figure. A comparison provides an input criterion for generating a displayable result.

Battery modeling provides a partial alternative to empirically generated look up tables. The concept of a battery model using multiple reservoirs with energy flowing between has previously been described. See for example:

1) "Hybrid Vehicle Simulation for a Turbogenerator-Based Power-Train"-C. Leontopoulos, M. R. Etermad, K. R. Pullen, M. U. Lamperth (Proceedings of the I MECH E Part D Journal of Automobile Engineering Volume 212, 1998, Pg 357-368)

2) "Temperature-Dependent Battery Models for High-Power Lithium-Ion Batteries" V. H. Johnson, A. A. Pesaran (Presented at the 17th Electric Vehicle Symposium, Montreal, Canada, Oct. 16-18, 2000)

3) "Battery Characterization System" Thomas J. Dougherty (US Patent application 2004/0212367 A1 Oct. 28, 2004)

4) "Lead Acid Battery Model" (Saber Electronic Simulator, Generic Template Library, October 1999, Synopsys, Inc. 700 East Middlefield RD. Mountain View, Calif.). Both electrical and hydrodynamic analogies have been proposed.

The general model provides an approximation of actual battery characteristics when implemented with modeling and simulation tools, and is useful in the design of electrical systems where batteries are involved. But the models are inadequate for a motor vehicle lead acid battery. The deficiencies have to do with the controlled conditions in design simulations vs. uncontrolled conditions in a vehicle and the need to synchronize in situ monitoring with a real battery.

There are several ways that synchronization can be lost between the model and the target battery. One way is for the initial conditions of the algorithm to be set different from the target. This would occur when the algorithm is initially started/reset, batteries are replaced, etc. Default parameters such as battery state of charge are unlikely to match the real battery in this case. Another loss of synchronization can occur if the device running the algorithm loses power when the vehicle is turned off. Finally, model error also causes loss of synchronization.

SUMMARY OF THE INVENTION

According to the invention there is provided a model which is readily evaluated by a computer using a minimal set of measured battery operating variables to provide an estimate of battery state of charge and to define and provide a battery state of recovery. The lead acid battery modeling system includes a voltage sensor connected to provide measurements of voltage across the terminals of a target lead acid battery, a current sensor coupled to provide measurements of current through the target lead acid battery, and a temperature sensor providing a measurement of a temperature expected to correspond to battery temperature. A vehicle body computer is connected to the sensors to receive the measurements of temperature, current and voltage. The vehicle body computer has a stored program defining an energy flow model for the target battery. The battery model includes an energy flow module with at least two energy storage reservoirs, a battery capacity calculation section for establishing an estimated capacity for the energy storage reservoirs and a module for predicting target battery output voltage. Upon execution by the body computer, the stored program is responsive to the measurements for adjusting the capacities of the energy storage reservoirs, determining the state of charge of the energy storage reservoirs and for predicting the output voltage of the target battery. Comparison of the predicted voltage and the measured battery output voltage allow synchronization between the energy flow module and the target battery.

Additional effects, features and advantages will be apparent in the written description that follows.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

1. Environment of Application

Figure 1:
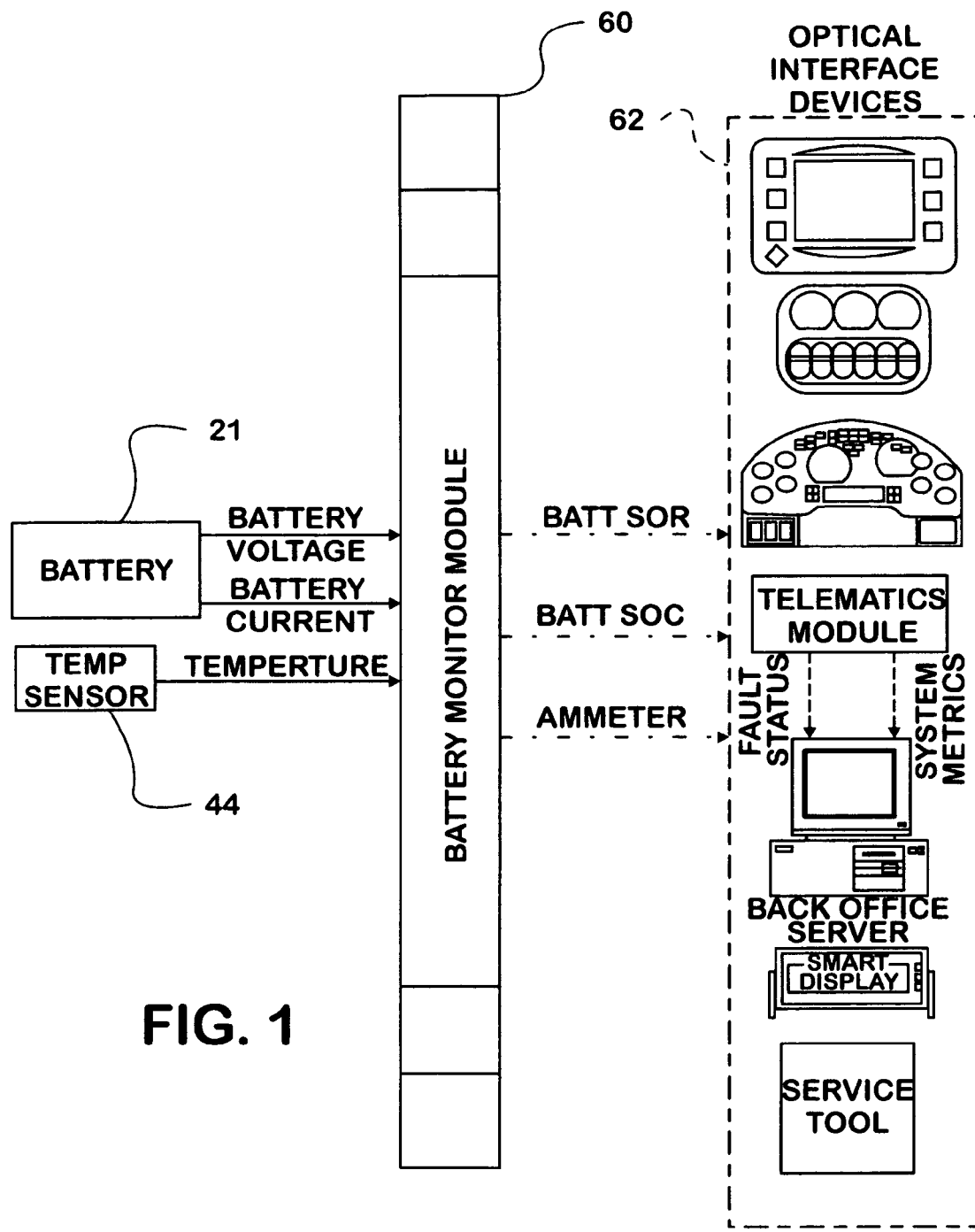
FIG. 1 is a high level block diagram of the invention.

FIG. 1 shows the environment of the invention at a high level of abstraction, with a battery 21 and a temperature sensor 44 connected to supply data inputs (battery voltage, battery current and temperature) to a battery monitor module 60. Ideally the temperature reading is battery temperature, though another source may be used if reliably related to battery temperature. In truck applications where the batteries are carried on vehicle side rails removed from the engine compartment the use of ambient temperature is acceptable. The battery monitor module 60 may be realized as a program running on a vehicle body computer. Through such an implementation the output of the monitoring program may be reported to any of a group 62 of interface systems including: a display, a gauge pack, a driver instrument panel; a telematics system; a smart display; or a worker's service tool. Data reported includes battery state of charge (SOC), battery state of recovery (SOR) and measured amps. SOC and SOR are defined more completely herein.

Figure 2:
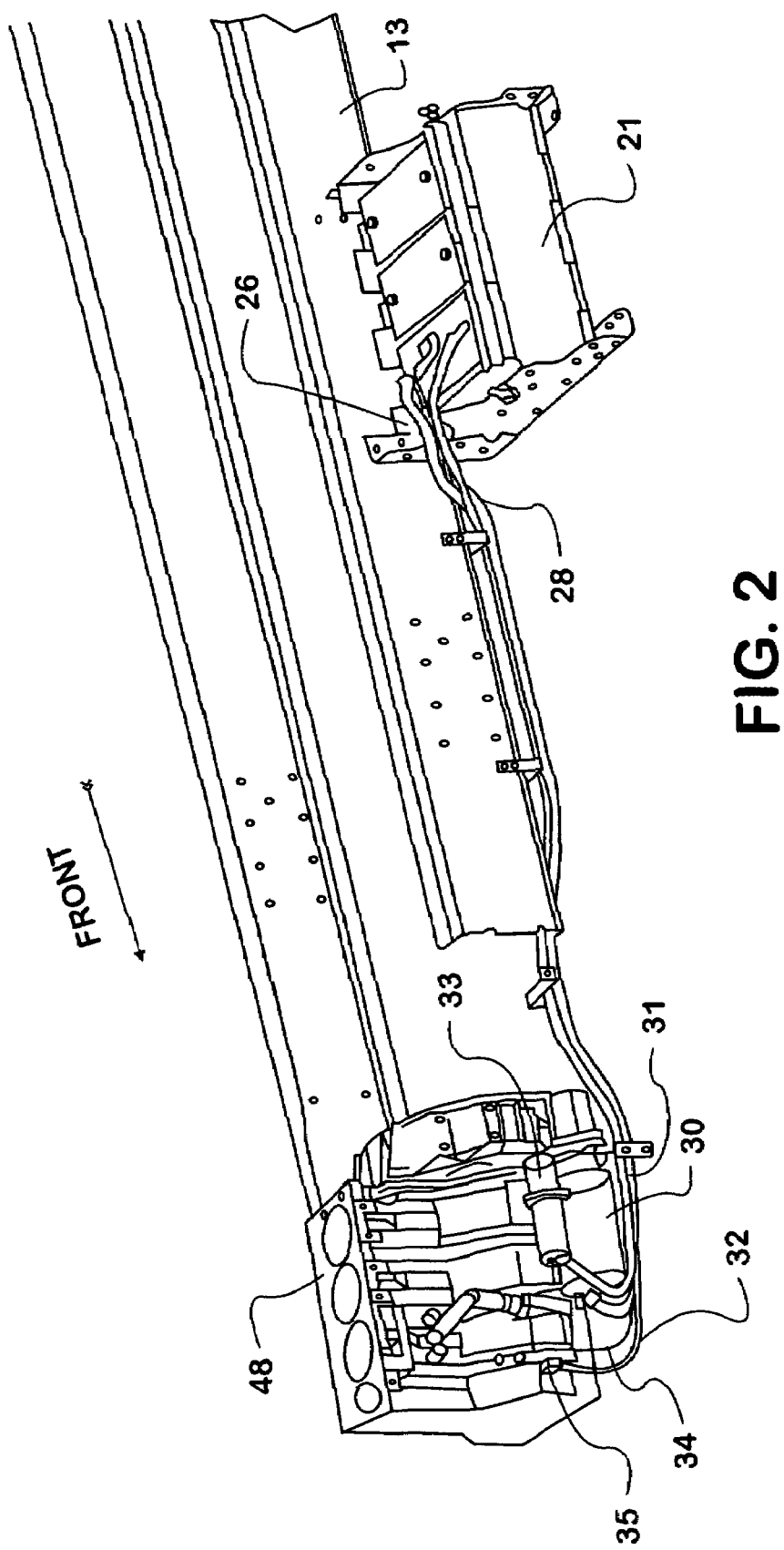
FIG. 2 is a perspective view of a truck side rail illustrating mounting of a battery array.

FIG. 2 illustrates an array of batteries 21 and the manner of connection of the batteries to a starter system 30 for an engine 46 installed on vehicle 11. Batteries 21 are connected in parallel to supply a high amp/hour capacity to vehicle starter system 30 during cranking. A negative terminal battery cable 26 is connected from a negative terminal of one of batteries 21 to a terminal of a starter motor 31, both of which are connected to the vehicle chassis, which serves as a floating ground in a conventional manner. A positive terminal battery cable 28 is connected between a positive terminal from the same one of batteries 21 to an input terminal on a starter system component 33. Terminal cables 26 and 28 are usually 0000AWG cables of known length, and readily determined resistance (usually as a function of temperature). Two instrumentation wires 32 and 34 are also illustrated running from separate terminals on battery 21 to locations adjacent engine 46. Instrumentation wire 34 is connected to chassis ground and wire 32 to a connector box 35.

Figure 3:
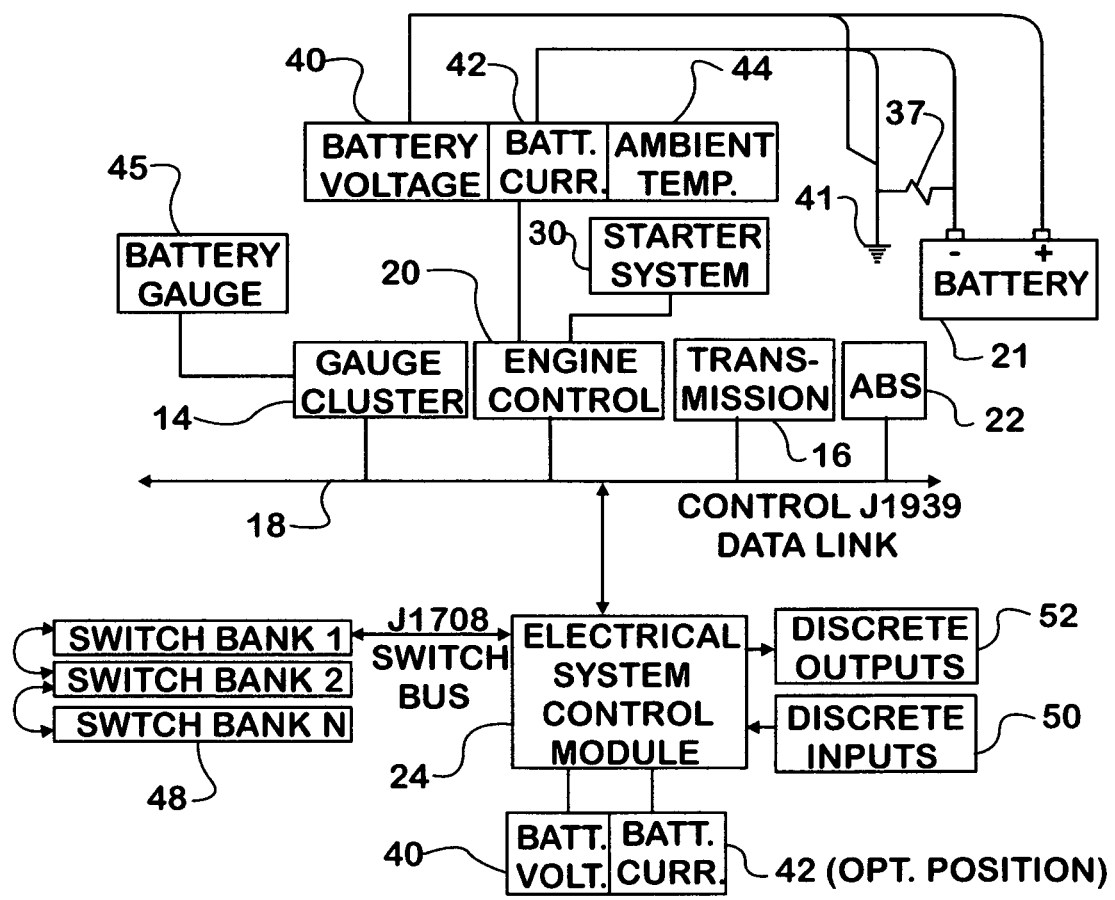
FIG. 3 is a schematic overview of a motor vehicle control system incorporating battery monitoring allowing modeling of the battery.

FIG. 3 illustrates electronic control of a vehicle 11 schematically, based on a network and an overall electrical system controller (ESC) 24. ESC 24 communicates with several autonomous controllers over a SAE J1939 data link 18, including a gauge cluster 14, a transmission controller 16, an antilock brake system controller 22 and an engine controller 20. Each of these local autonomous controllers may in turn receive data directly from switches and sensors, as ESC 24 does from a switch bank 48 and discrete input section 50. Discrete inputs may include ignition key switch position and start button position. Each local controller may provide control or informational signals to local, discretely controllable components, as ESC 24 does with discrete output section 52.

Engine controller 20 is commonly used to monitor a number of operational sensors on a vehicle 11 because of the immediate need of the engine controller for such measurements in controlling fuel flow to engine 46. Some of these measurements relate to the battery monitoring algorithm of the invention. Engine controller 20 is illustrated as connected to receive measurements from a battery voltage sensor 40, a battery current sensor 42 and an ambient temperature sensor 44. Battery voltage sensor 40 and battery current sensor 42 are connected to terminals of a battery 21 to provide electrical output readings relating to battery performance. Alternatively, battery voltage and current sensors 40 and 42 may be connected to ESC 24, or may communicate to ESC 24 over bus 18. Battery voltage measurement requires connection across the negative (or chassis ground 41) and positive terminals of battery 21. Current measurement is made by measurement of the voltage drop along the length of the negative terminal battery cable, the resistance of which is represented by a resistor 37 connected between the negative terminal of battery 21 and chassis ground 41. The resistance of negative terminal cable 26 is a fraction of an ohm and thus a fraction of the internal resistance (IR) of battery 21 and the effect of the battery terminal cable's resistance can be disregarded in measuring of the voltage difference between battery terminals. Ambient temperature from sensor 44 is taken as a proxy for battery internal temperature, though those skilled in the art will realize that a direct measurement of battery temperature would be preferred.

The vehicle electrical system includes other components used in practicing the present invention. A gauge cluster controller 14 is used to control the display of data relating to the condition of battery 21.

Also under the control of the engine controller is a starter system 30, which is used to crank engine 46 and thus impose a load test on battery 21. Diesel engines commonly used on trucks generally require substantially more cranking and draw a higher current during cranking than do gasoline fired internal combustion engines. This is due to a lack of a spark source and reliance on compression induced ignition which occurs at substantially higher compression ratios. The greater compression imposes a greater load on starter motors than imposed by gasoline engines. Diesel engines have been found by the present inventors to impose enough of a load, for a long enough duration, to allow use for a load test, unlike conditions associated with gasoline engines. With a diesel engine one can be assured of at least 3 to 5 seconds of cranking time before an engine will began to generate power from partial ignition, assuring some constancy of conditions in performing the test. A starting system 30 may be used which forces cranking for a predetermined period once a command to start has been received from a human operator, either by turning an ignition key to the start position or by depression of a start button. Starting system 30 may be automated, however, if it is, a safety interlock is provided keyed on a maintenance profile of the truck.

Figure 4:
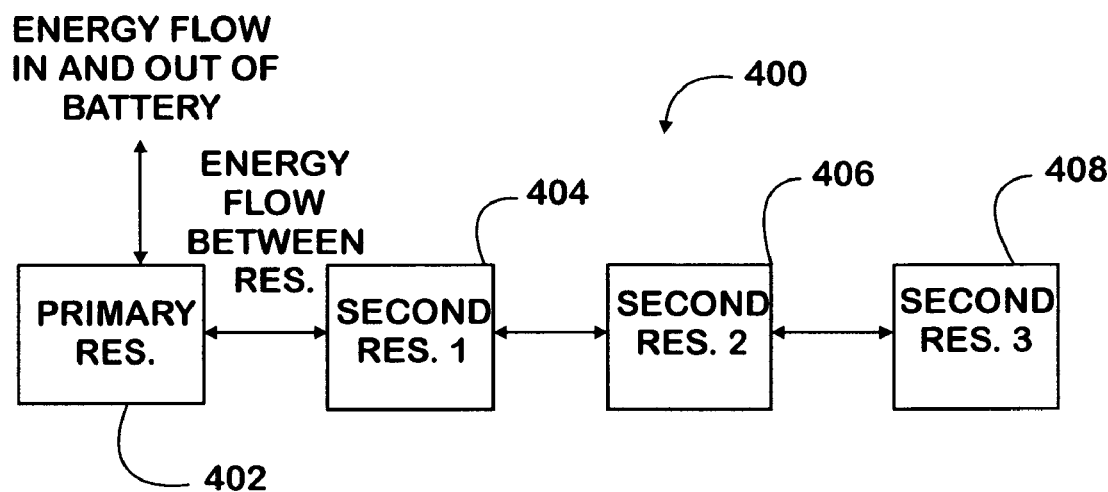
FIG. 4 is a high level block diagram of a generic battery model.

FIG. 4 is a high level depiction of a battery model 400 generalized to apply to several modeling approaches, including the one adopted in the present invention. Battery model 400 depicts the energy potential of a battery as held in each of several reservoirs 402, 404, 406 and 408. The primary reservoir 402 represents the energy "presently" available to vehicle systems, in effect "short term" or "primary" change. The energy stored in the primary reservoir 402 is taken to be the primary state of charge (PSOC). Not all energy is available immediately. The remaining secondary reservoirs 404, 406 and 408 represent energy available after a time delay or at a reduced rate of delivery. In some sense this may be taken as corresponding to the physical reality of the battery although the reservoirs do not correspond literally to any particular physical or chemical mechanism of the battery (e.g., a secondary reservoir may primarily relate to time delay occurring as locally depleted electrolyte is replenished, or fresh electrolyte circulates into contact with exposed electrode plates). While reservoirs are depicted as serially connected it is possible that a mix of parallel and series connections with different allowed flow rates could also be used. The battery's total state of charge (TSOC) is an accumulation of PSOC and SSOC.

Figure 5:
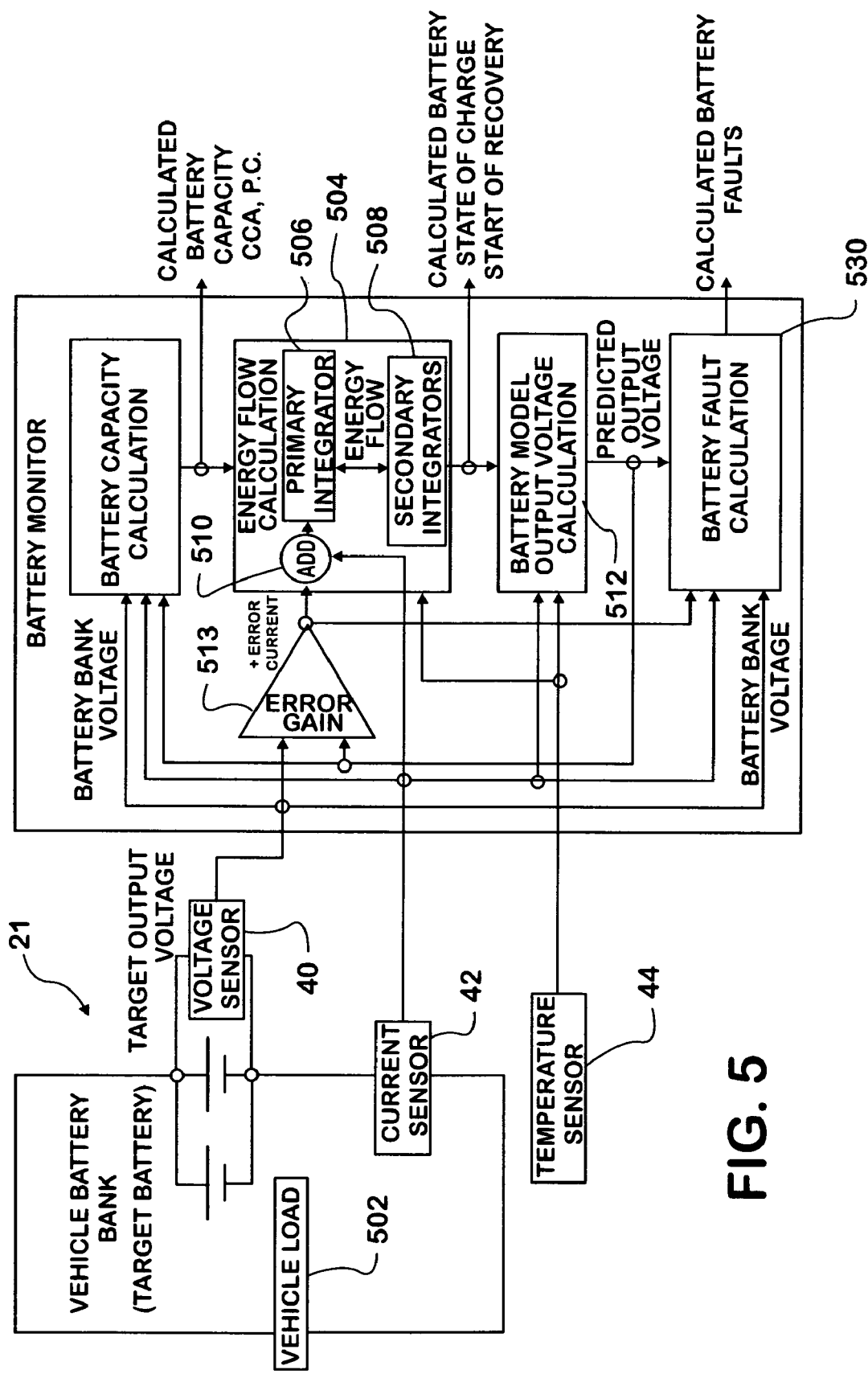
FIG. 5 is a data flow diagram of the battery model of the invention.

FIG. 5 is a block diagram illustration of the battery monitor program 500 of the invention. Battery monitor program 500 has four major sections including: (1) an energy flow calculation module 504; a battery model output voltage calculation 512; a battery capacity calculation module 522; and a battery fault calculation module 530. The Energy Flow Calculation section 504 is the basic model, and generates estimates of the battery's state of charge and state of recovery. The Primary State of Charge and battery current are used in the "Battery Model Output Voltage Calculation" section 512 to generate a predicted battery voltage. This section uses empirically derived tables to handle non-linear characteristics in the model. Ideally this voltage will match the measured battery voltage. A mismatch indicates that parameters in the model do not match those of the vehicle batteries. The Predicted Output Voltage (POV) from the Battery Model Output Voltage Calculation 512 is supplied to a comparator 513 for comparison to measured battery 21 voltage (Target Output Voltage (TOV)) and generation of an error current. This error current is used to synchronize the model State of Charge with that of the target battery by its use in adjusting the battery current measurement signal applied to the energy flow calculation. The Battery Capacity section 522 calibrates model energy capacity to the capacity of the target battery 21. The battery fault calculation section 530 determines battery 21 failures in different ways. First, since several model parameters are synchronized to that of the target battery (SOC, CCA, RC), these parameters can be compared to normal operating limits. If a parameter exceeds a limit, a battery fault is declared. Error current is also monitored. If this current exceeds a predefined limit for an extended time, it is a indication of a fault condition (i.e. a shorted battery cell).

Battery 21 is illustrated as connected to support vehicle loads 502. Sensors including a voltage sensor 40, a temperature sensor 44 and a current sensor 42 are associated with the battery 21 to supply data to the monitor program 500. Monitor program 500 represents a model of the battery 21 in which energy flows between reservoirs over time. The model is implemented primarily through a "Energy Flow Calculation" 500 which uses integrators 506 and 508 to emulate energy storage. The purpose of the energy flow calculation 500 is to estimate the battery condition, which has three components, Primary State of Charge (PSOC), Secondary State(s) of Charge (SSOC), and State of Recovery (SOR). The block marked "Secondary Integrators" 508 can represent multiple integrators. PSOC and SSOC have already been defined. SOR represents the degree to which a battery has returned to an equilibrium condition. A high SOR reflects all integrators having approximately the same (normalized) SOC. A low SOR indicates that the SOC for one integrator is greatly different from that of another. The energy flow calculation 504 uses all three primary inputs, battery voltage, current and temperature. Temperature determines the gains used with energy flow calculations between energy reservoirs. Net energy flow into and out the battery 21 comes from adjusting battery current by an error signal through a error gain amplifier 513. The error signal applied to amplifier 513 is generated from predicted voltage provided by a battery model output voltage calculation 512. The other input to amplifier 513 is the currently measured battery voltage. This error current from amplifier 513 is applied to a summing junction 510 with the measured battery current and supplied directly to the primary integrator 506 as adjusted battery current. It may be seen that the output to the primary integrator from summer 510 may be positive or negative depending on whether energy is being drawn from the battery or not. PSOC and SSOC may be summed to generate a total state of charge (TSOC). The outputs, PSOC, SSOC, TSOC and SOR are supplied the module 512 for predicting battery output voltage and are made available for display.

2. Energy Flow and Calculation

Figure 6:
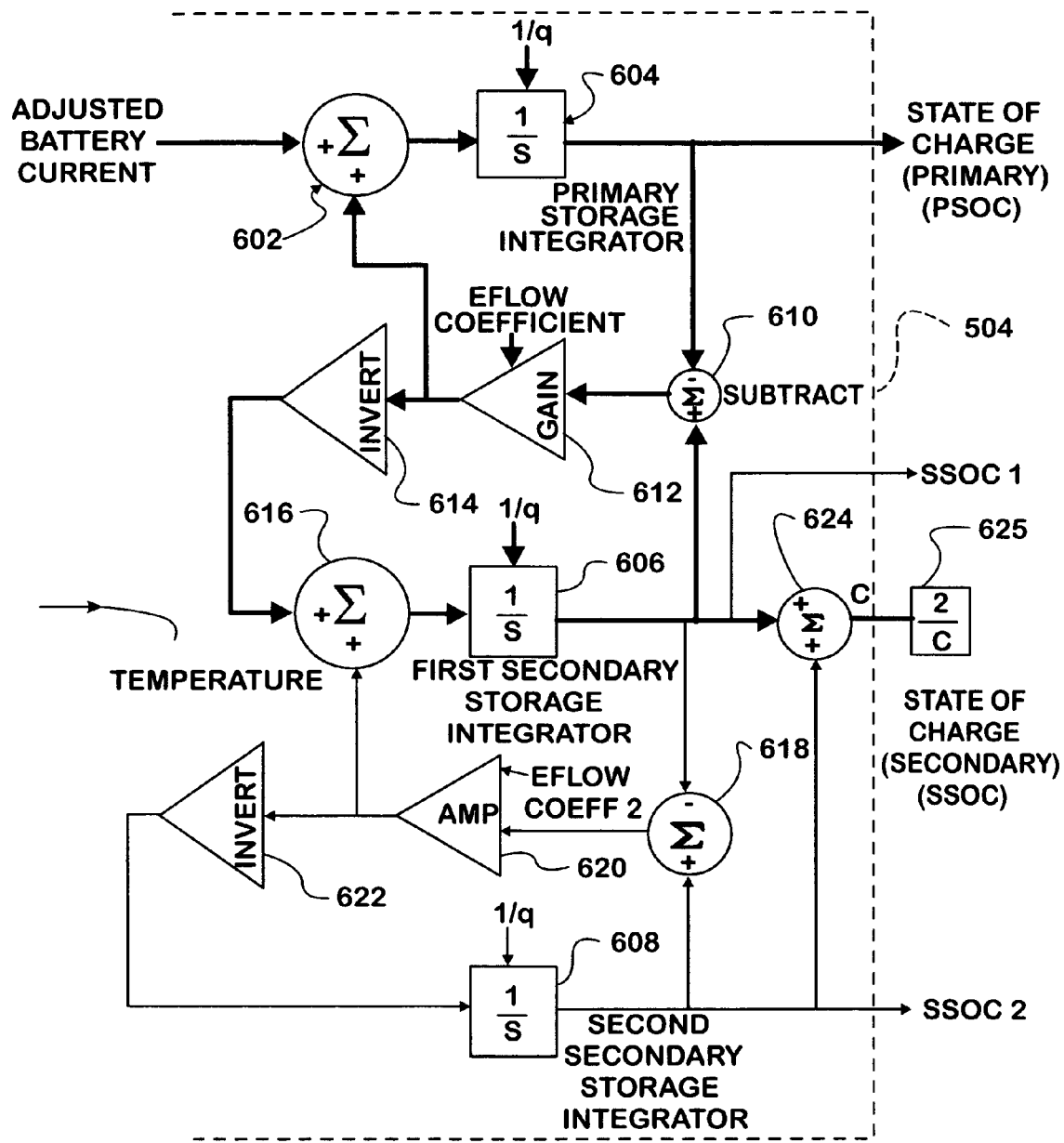
FIG. 6 is a more detailed view of energy flow in the model of FIG. 5.

FIG. 6 illustrates in more detail the operation of the Energy Flow Calculation 504. It was stated previously that the energy stored in a battery is modeled as reservoirs of energy. Each of these reservoirs can be represented mathematically as total charge equaling the integral of current with respect to time. It is useful to normalize this relationship such that a result of "one" equals the maximum storage capability of a reservoir. This also represents 100% State of Charge for that reservoir. In the model of the present invention the reservoirs are marked as storage integrators. The outputs of any storage integrator is normalized and thus is a number between 0 (0% SOC) and 1 (100% SOC). These integrators can now be put together in a way that represents the multiple reservoirs of each battery cell and movement of energy between the reservoirs. The Primary State of Charge and battery current are used in the "Battery Model Output Voltage Calculation" section to generate a predicted battery voltage. This section uses empirically derived tables to handle non-linear characteristics in the model. Ideally this voltage will match the measured battery voltage. A mismatch indicates that parameters in the model do not match those of the vehicle batteries. The value 1/q provided for each integrator is the normalized value of the capacity (q) of each respective integrator supplied by battery capacity calculation section 522.

A model incorporating one primary integrator 604 and two secondary integrators 606, 608 is illustrated, however a larger or smaller number of secondary integrators is possible with two being selected purely for illustrative purposes. Increasing the number of integrators will increase the accuracy of the model. The output of a primary storage integrator 604 is controlled by energy derived from the adjusted battery current and energy from the first secondary storage integrator 606. The output of the primary integrator (normalized) is the Primary State of Charge (PSOC) and is made available to outside of the module 504. A first secondary integrator is controlled by energy derived from the primary integrator and a second secondary integrator 608. Through a summer 624 is the output of the first secondary integrator 606 and the second secondary integrator 608 made available outside of the module 504 as the SSOC. Secondary states of charge (SSOC1, SSOC2) from integrators 606, 608 may also be made available depending the requirements of a given application.

The amount of energy flowing between the integrators is determined by applying a gain to the difference in the outputs. This gain becomes the Energy Flow Coefficients (eflow) which are supplied to amplifiers 612 and 620 to determine the energy flow rate between integrators. The energy flow coefficients are determined empirically and are temperature compensated using the measurement of ambient temperature from temperature sensor 44. It is evident that when battery current equals zero, the outputs of the integrators move toward equilibrium (and because the outputs are normalized, also equality) as energy flow between integrators falls to zero.

In the Energy Flow Calculation section 504 battery current is summed with the output of amplifier 612 (representing energy flow from or into secondary storage integrator 606) to provide a system energy flow input to primary storage integrator 604. The output of the primary storage integrator 604 is the PSOC. The difference between PSOC and the state of charge from the first secondary storage integrator 606 (SSOC1) is determined by summer 610 (with PSOC subtracted from SSOC1) and fed to amplifier 612. The output from amplifier 612 is also connected to an inverter 614 and the output of the inverter coupled to the first secondary storage integrator 606. Thus the flow of charge from an secondary integrator to a higher stage secondary integrator or the primary energy storage integrator is matched by addition of its negative to the source. If battery current reflects charging, charge will eventually flow from primary storage integrator 604 to first secondary storage integrator 606 (i.e. the negative output of amplifier 612 is inverted and accumulated by secondary storage integrator 606 until the state of charge of secondary storage integrator 606 equals that of the primary storage integrator 604. If battery current reflects discharging of the battery 21 the primary storage integrator 604 will be drained and energy will begin to flow from secondary storage integrator 606 to the primary storage integrator 604.

The second secondary storage integrator 608 has a relationship to the first secondary storage integrator 606 that is essentially the same as the relationship of the first secondary storage integrator to the primary storage integrator 604. Summer 618 provides a difference signal by subtracting the state of charge from the first secondary integrator 606 from the state of charge of the second secondary integrator 608. The resulting value is applied to amplifier 620 the gain of which is controlled by a energy flow coefficient eflow2. Where the state of charge of integrator 608 exceeds that of integrator 606 energy is indicated flowing from integrator 608 to integrator 606 and its inverse (through inverter 622) is added to integrator 608. Where the state of charge of integrator 608 is less than that of integrator 606 energy flow is reversed. The eflow gain coefficient for each integrator is independently determined.

Secondary state of charge (SSOC1, SSOC2) may be supplied from each of the secondary storage integrators 606, 608 individually, or it may be accumulated and renormalized (summer 624 and normalization calculation 625) to provide an accumulated secondary state of charge (SSOC).

Figure 7:
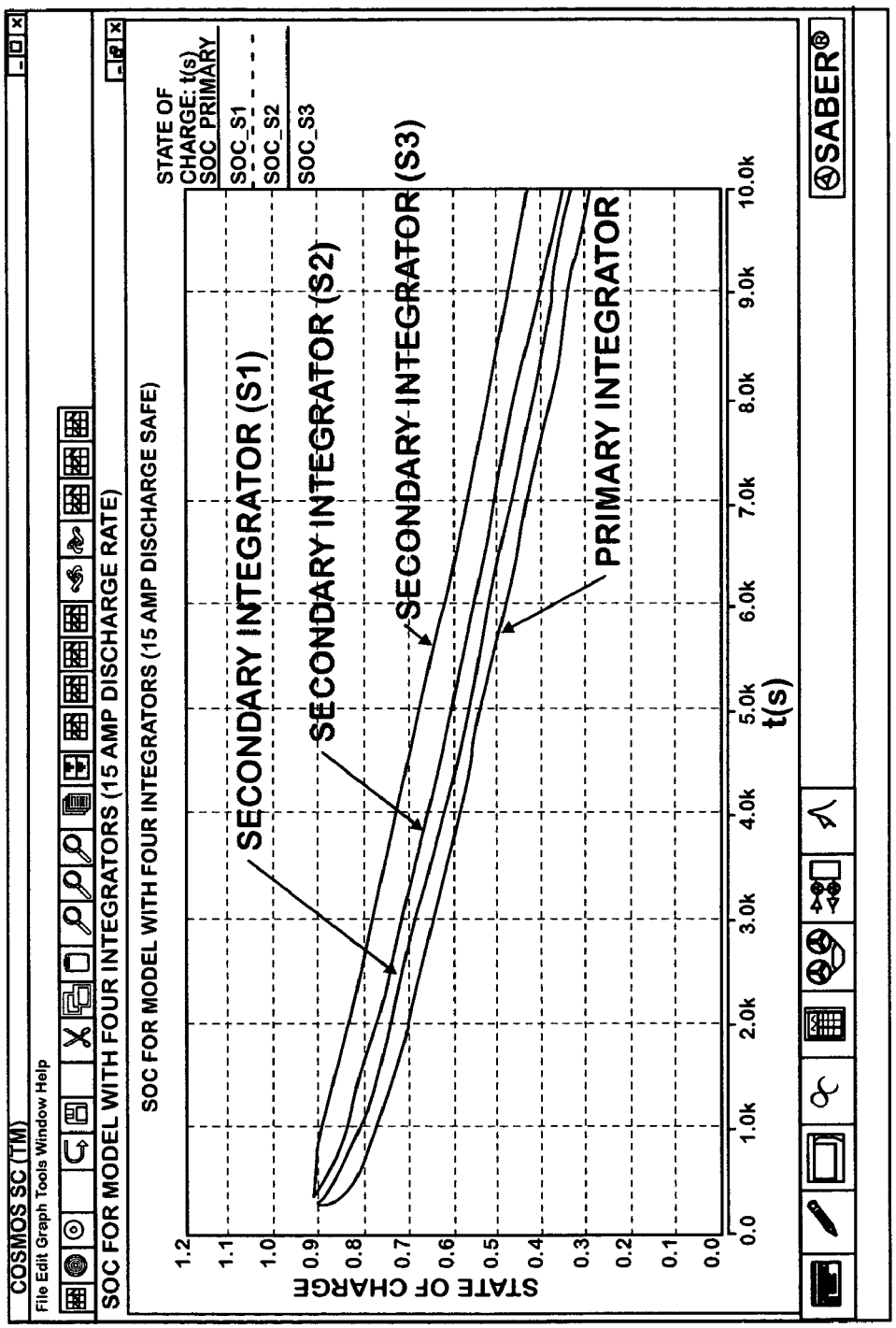
FIG. 7 is a graph of battery model incorporating a plurality of current integrators.

The graph in FIG. 7 shows the State of Charge for a model with four integrators. At the beginning of this simulation, all the integrators are set to a 90% state of charge (arbitrarily), then a 15 amp discharge is applied. Initially the PSOC of the primary integrator drops quickly, but soon energy begins to be transferred from the secondary integrators upstream to the primary in a cascade like sequence, and the declines of each integrator become parallel with the deepest reservoir retaining a slightly greater state of charge than each successively shallower reservoir until the primary integrator is reached.

Figure 8:
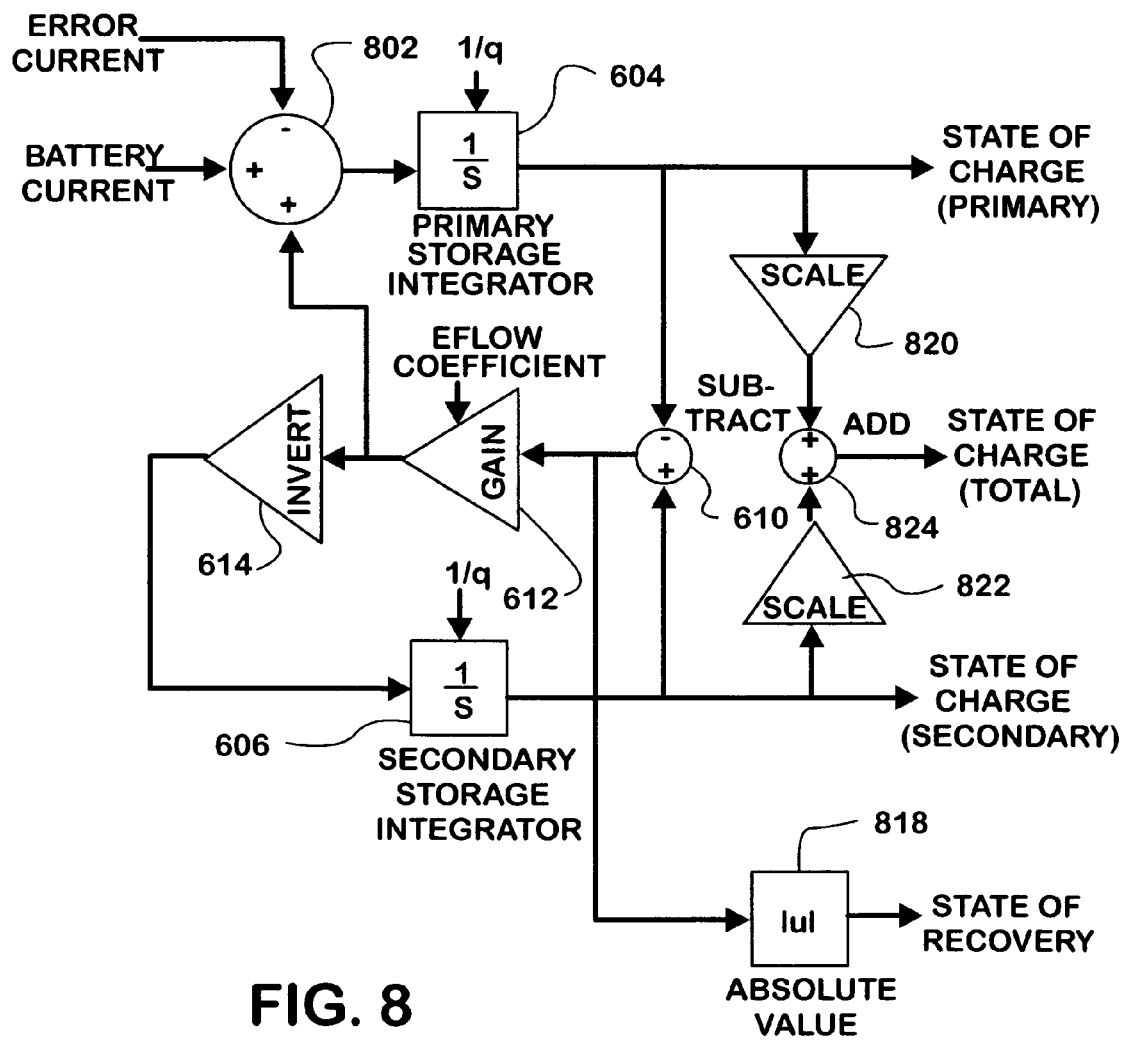
FIG. 8 is a graphical depiction of energy flow in the battery model of the invention.

FIG. 8 expands the model of FIG. 6 to provide total state of charge (TSOC) and the State of Recovery. It also indicates the use made of error signal. A two integrator model is presented for the sake of simplicity. Most of the model is the same as that of FIG. 6 except that an error signal is subtracted from the input to the primary storage integrator 604 and additional output signals are calculated.

The error current is applied to a modified summer 802 for input to the primary integrator 604. The error current is generated from measured battery 21 voltage and predicted battery voltage, which is calculated in the battery model output voltage calculation section 512. The error signal directly effects the output of the integrators and the model's State of Charge. The error signal is generated by applying a gain to the difference of the Predicted Output Voltage (POV) and the measured battery voltage (Target Output Voltage (TOV)). Its use is to synchronize the model's State of Charge to observed battery behavior. For example, if the target battery is discharged (e.g., SOC=40%) and it's terminal voltage is 11.7 v, but the model's algorithms are reset to 100% SOC with a Predicted Output Voltage of 12.7, the difference between the predicted and the actual is 1.0 v. If the error gain is 20, a current equal to a 20 amp discharge current would be injected into the primary integrator, with the effect of lowering the model's SOC. Error current would continue to flow until the model and target voltages equalized.

The model's total State of Charge is derived by scaling (weighting) 822, 820 and combining the SSOC of all the integrators. The scaling factors are calculated by dividing the capacity (q) of each integrator by total battery capacity. Since the model is synchronized with the target, model SOC can be equated to the SOC of the target battery.

The algorithm extracts another parameter from the model, called State of Recovery (SOR). As can be seen from the model, this value results from the absolute value 818 in difference in the outputs of the integrators 604, 606. If the integrators are equalized (a difference of zero), the SOR equal 100% (totally recovered). An SOR of 0% is produced when one of the integrators is fully charged, and one is fully discharged. In practical terms, a low SOR would result during periods of high battery discharge, typically when the Primary storage integrator 604 is discharged but the secondary storage integrator 606 is not. SOR can be a valuable parameter since the output voltage of the battery is controlled by the charge on the primary integrator only. SOR provides an indication of the relative state of depletion of the primary integrator when compared with the rest of the battery. Allowing the battery to rest restores the charge in the primary integrator.

3. Calculating Predicted Output Voltage

Figure 9:
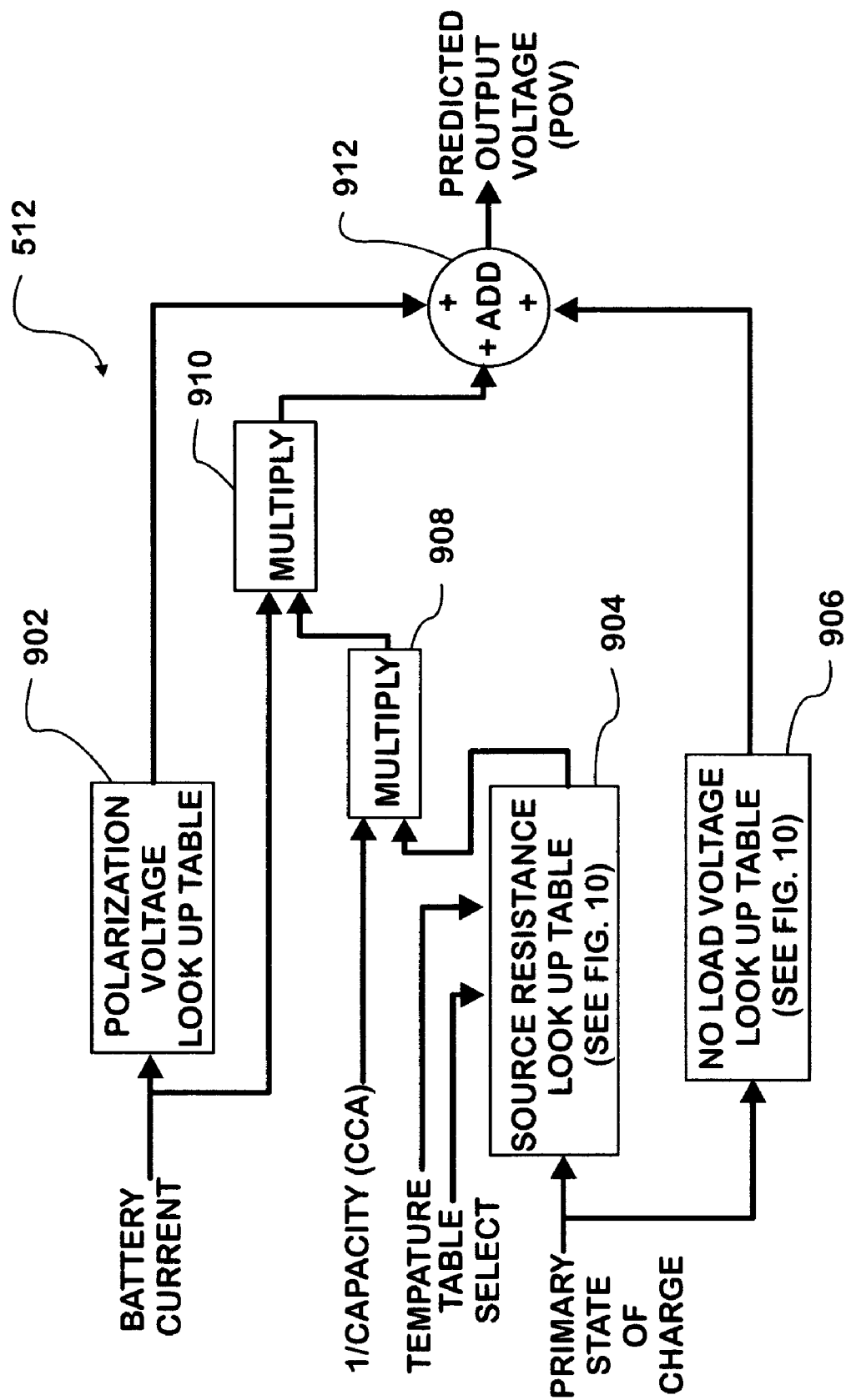
FIG. 9 is a graphical illustration of determination of predicated output voltage of the battery model for synchronization.

Referring to FIG. 9 the operation of the battery model output voltage calculation 512 is illustrated. The output of this section is the Predicted Output Voltage (POV) which is the voltage that the model determines should exist at the output terminals of the target battery. POV is used to generate an error current which is used to synchronize the model with the target battery 21 and for diagnosing faults in the battery fault calculation section 530. Predicted voltage is determined primarily from the PSOC calculation supplied by the primary integrator 604, measured battery current, and a polarization factor. Since the polarization factor, the source resistance and predicted no-load voltage as a function of primary state of charge are non-linear, the model uses empirically derived lookup tables at this point. The source resistance table is divided into two subtables. One is selected when the battery is charging, the second is selected when it is discharging.

The PSOC provides the argument applied to both the source resistance look up table 904 (along with temperature) and into the no load voltage look up table 906. The result returned from the no load voltage look up table is applied directly to summer 912. The result returned from the source resistance look up table 904 is applied to multiplier 908 where it is multiplied with the inverse of the manufacturer's rated cold cranking capacity of the target battery 21. This result is in turn applied to a second multiplier 910 where it is multiplied with the measured battery current. Measured battery 21 current also provides the argument into a polarization voltage look up table 902. The returned value from LUT 902 and the output of multiplier 910 are both applied to summer 912 to provide a predicted output voltage (POV).

Figure 10:
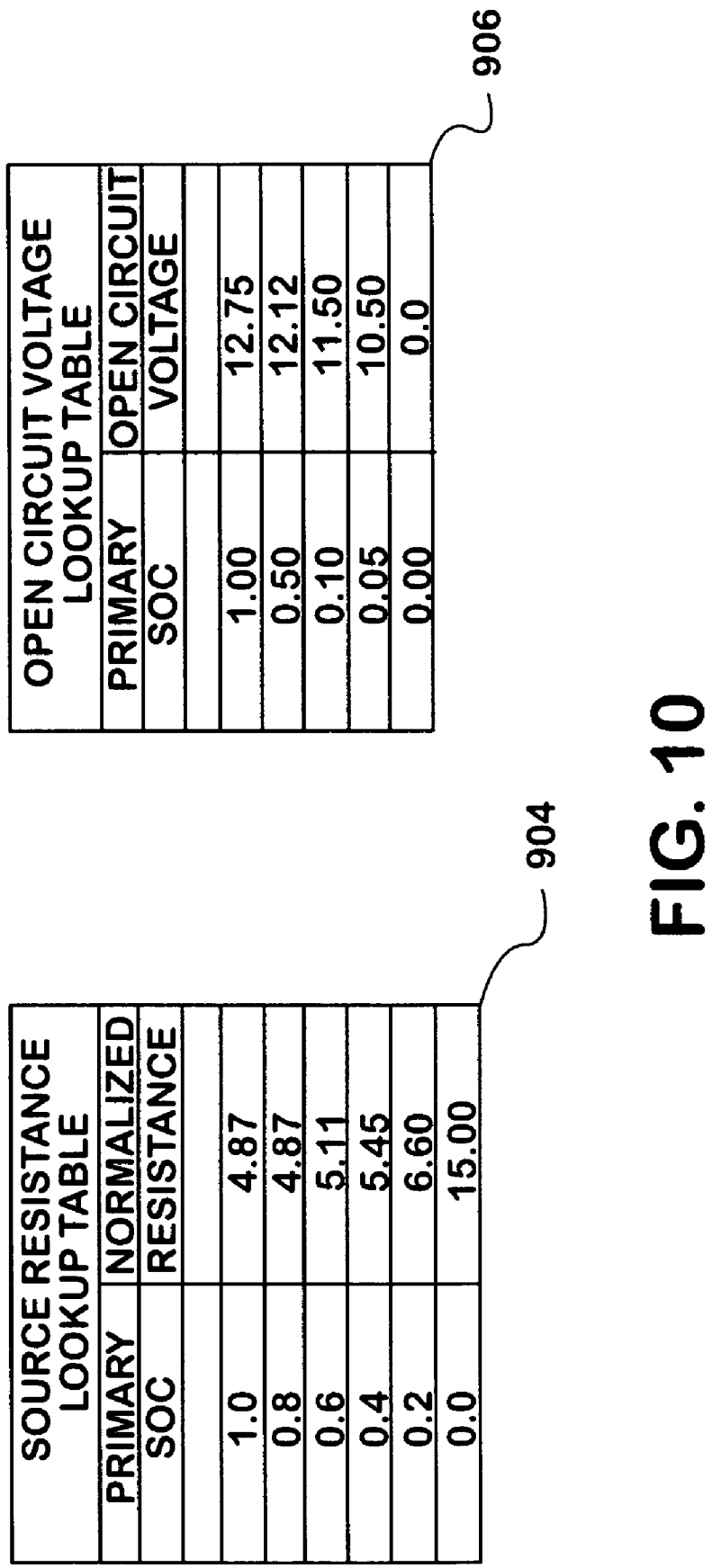
FIG. 10 illustrates look up tables used by the model.

Two examples of look up tables 904, 906 are given in FIG. 10. The "Source Resistance Lookup Table" gives normalized resistance values for various SOC at a given temperature. The values in this table are normalized to the rated size of the battery. For example, the resistance value from the table at 100% state of charge is 4.87. The actual resistance expected for a 650 CCA battery is therefore 4.48/650=0.0069 ohms. The Open Circuit Voltage table provides the expected voltage at the target battery terminals when the current at the battery terminals equal zero. Note that this table (along with the others) use the SOC from the primary integrator (as opposed to the combined SOC). This has the effect of allowing for transient voltages and battery recovery.

Figure 11:
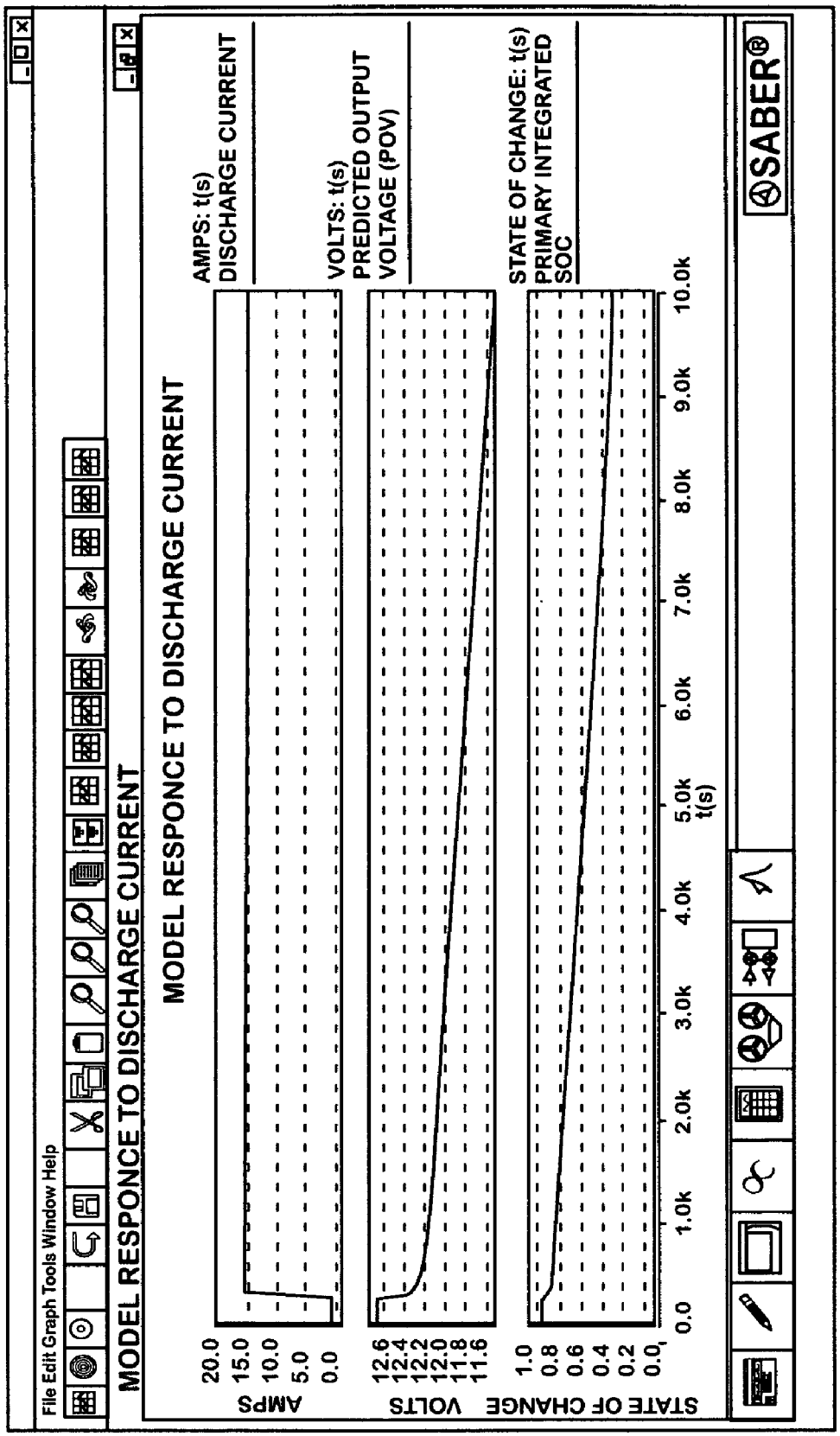
FIG. 11 is a graphical illustration of model response to discharge currents.

FIG. 11 is a graph showing the relationship of source resistance and SOC to Predicted Output Voltage. The example starts with the battery at rest and at a 90% State of Charge.

At rest, from 0 seconds to about 200 seconds elapsed, the output voltage matches the voltage derived from the "Open Circuit Lookup Table". A 15 amp load is applied at 200 sec. The POV drops quickly from about 12.6 volts to about 12.2 volts. This drop of about 0.4 volts has three components. Resistive drop due to the application of the 15 amp load (about 0.1 volt), the Polarization voltage drop (about 0.2 volts), and a drop due to a small but fast loss of charge in the primary integrator (from 90% to 85% SOC). After this, from 200 sec. to 10,000 sec., the drop in voltage is gradual, and reflects the loss of charge in the primary integrator.

Figure 12:
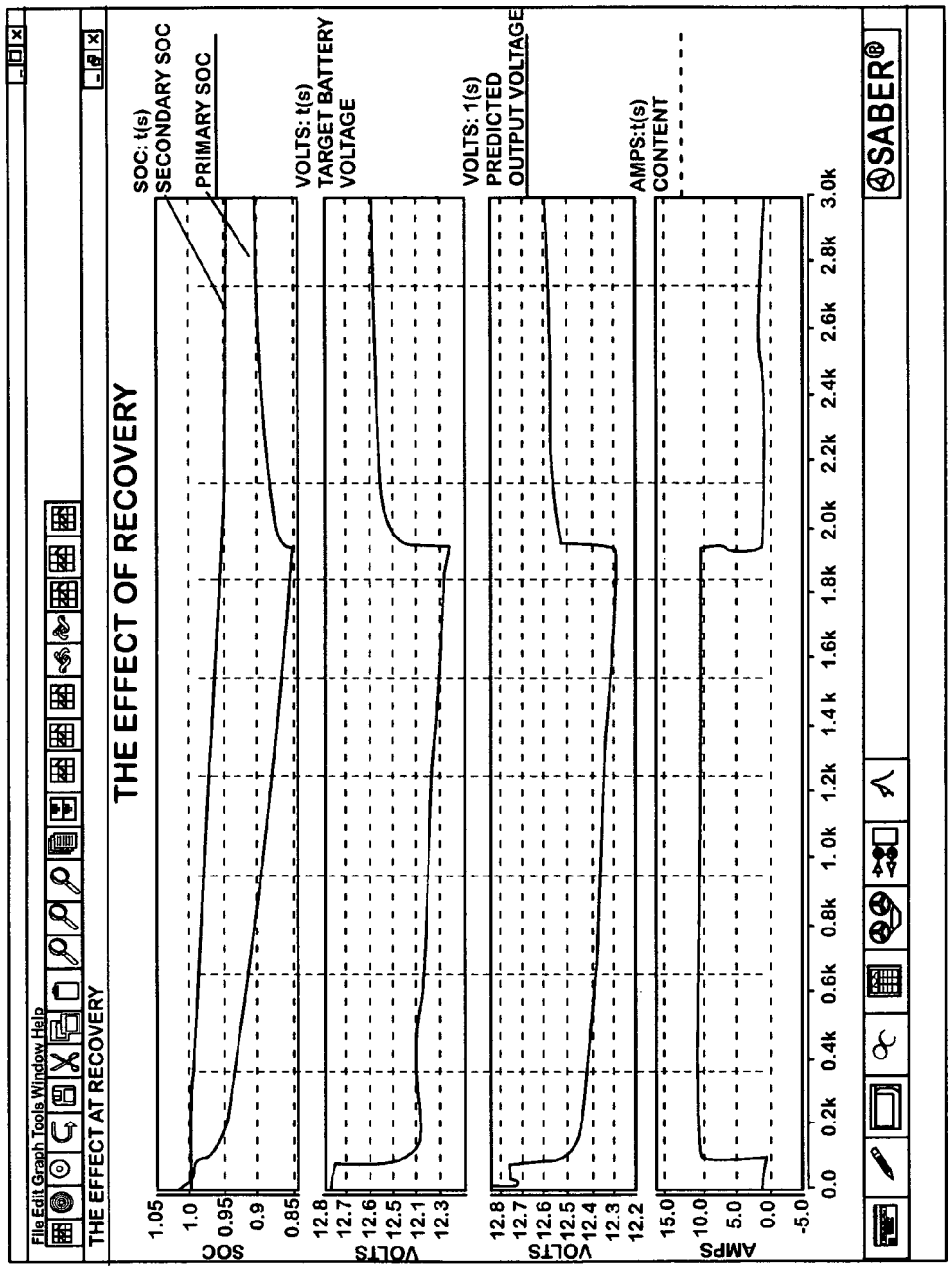
FIG. 12 is a graphical illustration of determination of the state of recovery of the target battery.

FIG. 12 shows the recovery effect of the primary integrator and the resulting Predicted Output Voltage. In this example, a 10 amp load is applied at 100 sec. and removed at 1950 sec. When the load is applied, the charge in the primary integrator quickly drops below that of the secondary integrator, and tracks lower the whole time that the load is present. But when the load is removed, energy flowing to the primary from the secondary, causes it's charge level to increase. This results in the gradual increase of POV starting at 2,000 sec. The example also shows the response of a real battery to this load. It is seen that the POV tracks closely with that of the target battery 21.

The battery monitor calculates battery capacity and uses this parameter in the model. Target battery capacity is synchronized to model capacity through the Capacity section 522 of the monitor 504. During these calculations, CCA relates to the size of the primary integrator and battery source resistance. Reserve capacity is related to the combined size of the primary and secondary integrators.

Figure 13:
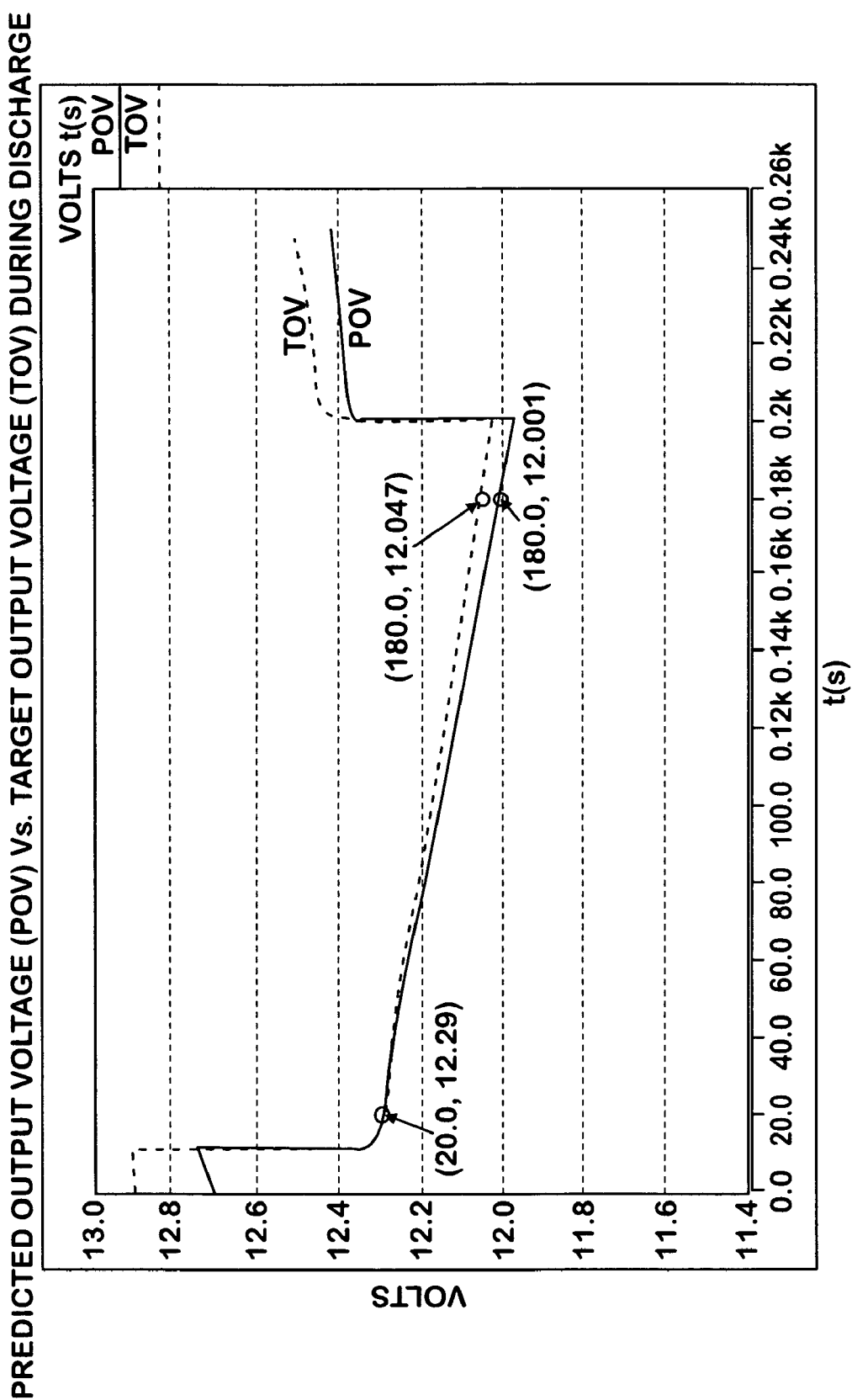
FIG. 13 is an exemplary graphical comparison of predicated output voltage against measured output voltage of the target battery.

The sizes of the primary and secondary integrators are determined in similar ways. The primary integrator however is adjusted during times of high discharge e.g. >200 amps, and secondary integrators are adjusted during longer periods of low discharge e.g. <50 amps. A high discharge rate serves the purpose of isolating the primary integrator from the secondary since the energy flow time constants are long compared to a fast discharge. A low discharge rate allows all the integrators to equalize with a small offset. Both of these adjustments compare the average slope of the Predicted Output Voltage with that of the Target Output Voltage. Capacity is incrementally adjusted dependent on this comparison. FIG. 13, for example, shows a POV with a greater slope then the TOV. This would cause the capacity of the integrators to be increased.

Integrator capacities are estimated for the model, being derived initially from manufacturer specifications of battery reserve capacity. The RC rating of the target battery is derived by the following equation:

$$RC=((Capacity/60)/25)*De\text{-rate Factor}$$

Dividing Capacity by 60 converts amp seconds to amp minutes. Dividing by 25 reflects the 25 amp discharge rate of the SAE specification. The de-rate factor is an empirically derived number of approximately 0.8. It is required because at a 25 amp discharge rate, only about 80% of the energy in the battery can be extracted before it's voltage drops below 10.5 volts.

Figure 14:
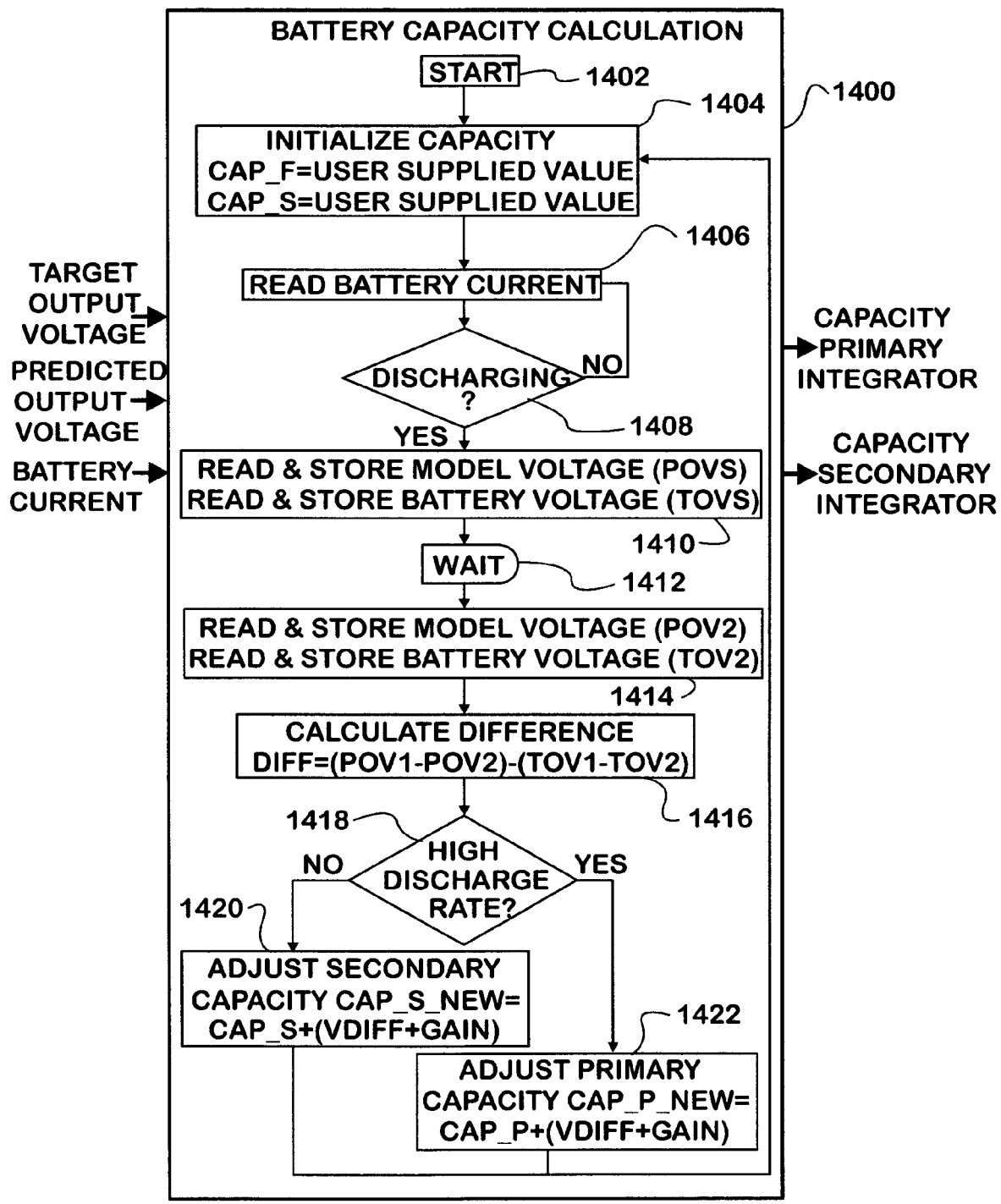
FIG. 14 is a flow chart of battery capacity calculation.

Referring to FIG. 14 an algorithm for calculating the capacity of the primary and secondary integrators in terms of ampere seconds (coulombs) is illustrated. Algorithm 1400 starts at step 1402. At step 1404 capacity (q or CAP) is initialized. The capacity of the primary integrator (CAP_P) and the secondary integrator (CAP_S) are provided by the user. Next, at step 1408 battery current is read. At step 1408 it is determined if the battery is discharging, permitting the capacity adjustments to be made. If not the program loops until discharging occurs. Once discharging has been detected execution advances to step 1410. At step 1412 battery 21 voltage (TOV) and predicted output voltage (POV) are read and stored as POV1 and TOV1. After a delay (step 1412) new values (POV2 and TOV2) are collected for the difference calculation step 1416 which produces the value VDIFF. At step 1418 the discharge rate is characterized as high or not. If the discharge rate is high the capacity q of the primary integrator is adjusted (step 1422). If the discharge rate is not high the capacity q of the secondary integrator(s) is adjusted (step 1420) and processing is returned to step 1404.

Figure 15:
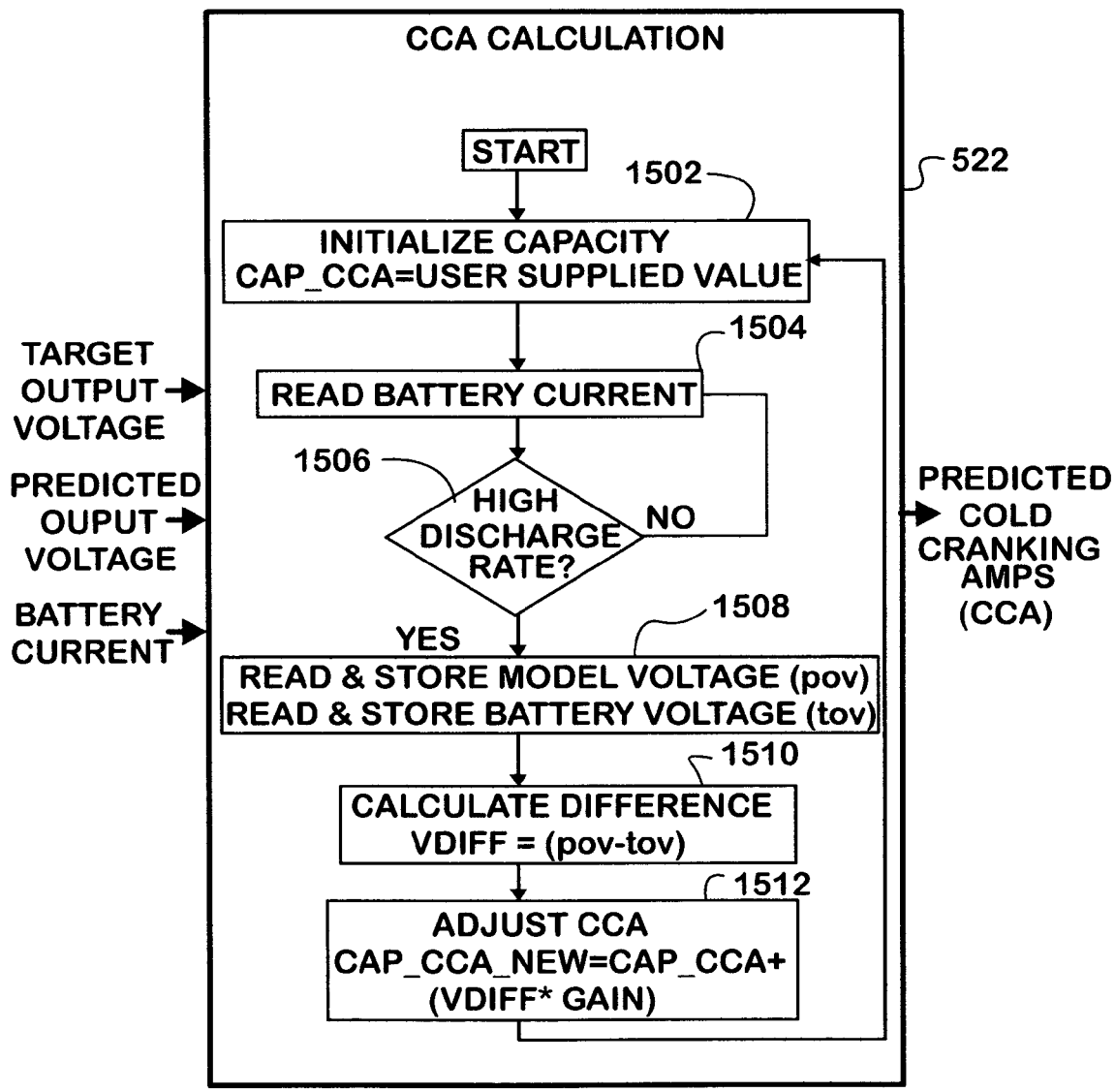
FIG. 15 is a flow chart of the cold cranking capacity of the battery.

Referring to FIG. 15 the section 522 for generating a predicted cold cranking capacity of the target battery 21 is illustrated. The inputs of the routine are measured battery 21 voltage (TOV), predicted output voltage (POV) and measured battery current. Initially at step 1502, the user supplied cold cranking amp (CCA) rating utilized is taken as a starting point. To begin adjustment of rated battery capacity battery current is read at step 1504. If the discharge rate is low as determined as step 1506 nothing can be done and execution returns to step 1504. Adjustment of the cold cranking capacity requires measurements to be taken during periods of high discharge, typically engine cranking. Once the discharge rate exceeds a threshold level program execution advances to step 1508 to read and store the predicted and measured values for battery voltage (POV and TOV). The CCA rating of the target battery is calculated by comparing the Predicted Output Voltage with the Target Output Voltage at one point in time during the period of high discharge, which in effect compares the instantaneous source resistance of the model to the target. This comparison assumes that the model state of charge is synchronized with the target. Step 1512 reflects adjustment of estimated battery capacity by adjusting the supplied value by the product of the difference in the measurements by an empirically derived gain factor.

Figure 16:
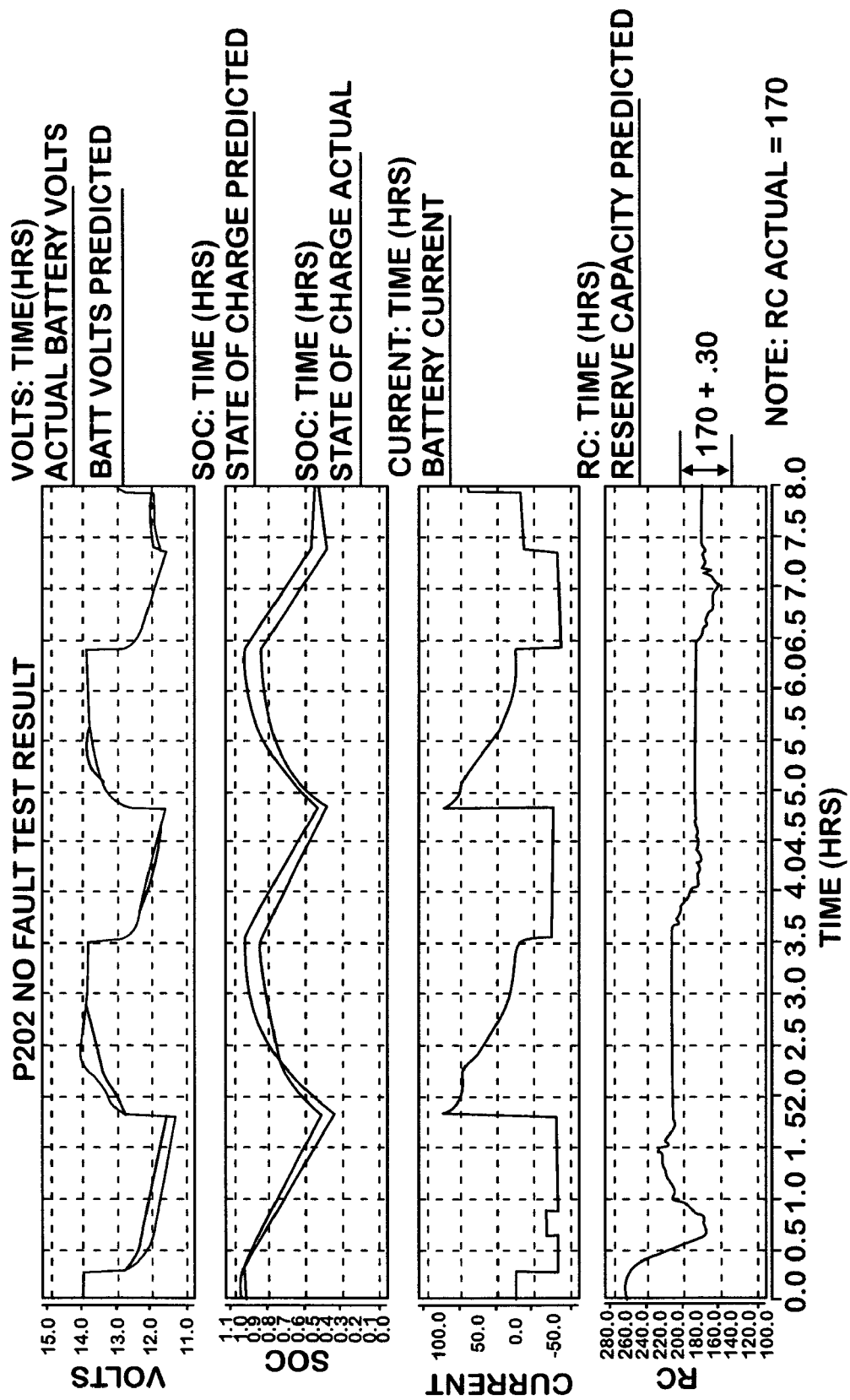
FIG. 16 is a series of graphs illustrating predicted battery operating variables.

FIG. 16 shows an actual test case in which the battery monitor was exercised in a vehicle for 8 hours. During this time the vehicle's batteries were exercised through two charge and three discharge cycles. This test was conducted to determine if the monitor could synchronize on the target batteries' reserve capacity rating, which was separately measured at 170 minutes. The RC rating of the monitor was initially set to 255. The bottom graph shows the monitor adjusting the RC rating during each discharge cycling. By the third discharge cycle the value is within the 30% error limit required for the test.

Since the battery monitor contains a mathematical model of a battery, it emulates the response of a functional non-faulted device. As mentioned previously, this response is compared with the target battery response. Differences in response indicate that battery parameters do not match model parameters. Small difference are expected and result from the fact that the model never can fully emulate the real device and are therefore considered modeling error. Large differences or differences that tend in one direction indicate battery degradation or a sudden battery failure.

The Battery Fault Calculation section 530 monitors these conditions and makes decisions concerning battery failures. Typically these conditions are determined by attaching limit to parameters to values already calculated in the model. These parameters are battery capacity (CCA, RC), and State of Charge. Another fault that can be detected is a shorted battery cell. This condition will result in a abnormally high error current in the model.

While the invention is shown in only two of its forms, it is not thus limited but is susceptible to various changes and modifications without departing from the spirit and scope of the invention.

What is claimed is:

1. A system for modeling a target battery installed on a motor vehicle comprising:
    a voltage sensor connected to provide measurements of voltage across the terminals of the target battery;
    a current sensor coupled to provide measurements of battery current through the target battery;
    a temperature sensor providing a measurement of a temperature expected to correspond to battery temperature; and
    a vehicle body computer connected to receive the measurements of temperature, current and voltage and having a stored program implementing an energy flow model of the target battery, the energy flow module having at least two energy storage reservoirs including a primary energy storage integrator and at least a first secondary energy storage integrator, the stored program being responsive upon execution by the vehicle body computer for using the measurements to adjust gains for the primary energy storage integrator and at least a first secondary energy storage integrator, to determine the state of charge from the primary energy storage integrator and the at least first secondary energy storage integrator and to predict the output voltage of the target battery.

2. A system for modeling a target battery as set forth in claim 1, further comprising:
    a comparator taking the predicted output voltage and measured battery voltage as inputs for generating an error signal related to the difference between the inputs; and
    a summer taking the error signal and the battery current as inputs and supplying an adjusted battery current as an input to the stored program indicating energy flow into or out of the target battery thereby synchronizing the energy flow model with observed battery operating variables.

3. A system for modeling a target battery as set forth in claim 2, the system further comprising:
    the primary energy storage integrator of the energy flow model having a feedback loop with a first gain element and the first secondary energy storage integrator having a feedback loop with a second gain element;
    the gains for the first and second gain elements being independently set.

4. A system for modeling a target battery as set forth in claim 3, the stored program further comprising:
    a module for determining capacity of the primary and the first secondary energy storage integrators; and
    a module for predicting output voltage of the target battery.

5. A system for modeling a target battery as set forth in claim 4, the stored program further comprising:
    the primary energy storage integrator and the first secondary energy storage integrator providing a primary and a secondary state of charge indication, respectively; and
    means for comparing the primary state of charge and the secondary state of charge for generating a state or recovery indication which is positively correlated with a diminishing difference between the indications of primary and secondary state of charge.

6. A system for modeling a target battery as set forth in claim 5, the stored program further comprising:

the module for predicting output voltage of the target battery receiving as inputs the measurement of battery current, the indication of primary state of charge and an exogenously supplied value for battery cold cranking amps and including an exogenously generated polarization voltage look up table which takes the measurement of battery current as an input argument, a source resistance look up table which takes the primary state of charge as an input argument and a no load voltage look up table which takes the primary state of charge as an input argument.

7. A system for modeling a target battery as set forth in claim 6, further comprising the target battery being a lead acid battery.

8. A system for modeling a target battery as set forth in claim 6, the stored program further comprising:

a fault detection module coupled to receive the adjusted battery current, measured battery current, target battery output voltage and predicted output voltage as inputs for comparison to limits for generating a fault indication upon out of limit operation.

9. A control system for a motor vehicle equipped with an electrical battery plant, the control system comprising:

a voltage sensor connected to provide measurements of voltage across the terminals of the electrical battery plant;

a current sensor coupled to provide measurements of battery current through the electrical battery plant;

a temperature sensor providing a measurement of a temperature expected to correspond to battery temperature;

a vehicle body computer connected to receive the measurements of temperature, current and voltage and having a stored program implementing for monitoring battery condition;

the stored program energy providing a module for an energy flow model having at least a primary energy storage integrator through which energy flow into and out of the battery is indicated as occurring and a secondary energy storage integrator which exchanges energy with the primary energy storage integrator, the stored program further providing an electrical battery plant output voltage prediction module and a module for adjusting gains for the primary and secondary energy storage integrators; and the stored program being responsive upon execution by the vehicle body computer for using the measurements to adjust the gains for the primary and at least first secondary energy storage integrators to determine the state of charge from the primary energy storage integrator and the secondary energy storage integrator and to predict the output voltage of the electrical battery plant.

10. A control system for a motor vehicle equipped with an electrical battery plant as set forth in claim 9, the stored program further comprising:

a comparator taking the predicted output voltage and the measurement of electrical battery plant voltage as inputs for generating an error signal related to the difference between the inputs; and a summer taking the error signal and the battery current as inputs and supplying an adjusted battery current as an input to the module for modeling energy flow of the electrical battery plant.

11. A control system for a motor vehicle equipped with an electrical battery plant as set forth in claim 10, the stored program further comprising:

the primary energy storage integrator of the energy flow model having a feedback loop with a first gain element and the first secondary energy storage integrator having a feedback loop with a second gain element;

the gains for the first and second gain elements being exogenously supplied.

12. A control system for a motor vehicle equipped with an electrical battery plant as set forth in claim 11, the stored program further comprising:

a module for determining capacity of the primary and the first secondary energy storage integrators; and a module for predicting output voltage of the electrical battery plant.

13. A control system for a motor vehicle equipped with an electrical battery plant as set forth in claim 12, the stored program further comprising:

the primary energy storage integrator and the first secondary energy storage integrator providing a primary and a secondary state of charge indication, respectively; and means for comparing the primary state of charge and the secondary state of charge for generating a state or recovery indication which is positively correlated with a diminishing difference between the indications of primary and secondary state of charge.

14. A control system for a motor vehicle equipped with an electrical battery plant as set forth in claim 13, the stored program further comprising:

the module for predicting output voltage of the electrical battery plant receiving as inputs the measurement of battery current, the indication of primary state of charge and an exogenously supplied value for battery cold cranking amps and including an exogenously generated polarization voltage look up table which takes the measurement of battery current as an input argument, a source resistance look up table which takes the primary state of charge as an input argument and a no load voltage look up table which takes the primary state of charge as an input argument.

15. A control system for a motor vehicle equipped with an electrical battery plant as set forth in claim 14, further comprising the electrical battery plant being a lead acid battery.

16. A control system for a motor vehicle equipped with an electrical battery plant as set forth in claim 14, the stored program further comprising:

a fault detection module coupled to receive the adjusted battery current, measured battery current, electrical battery plant output voltage and predicted output voltage as inputs for comparison to limits for generating a fault indication upon out of limit operation.

* * * * *